United States Patent [19]

Iwasa et al.

[11] Patent Number: 6,074,801
[45] Date of Patent: Jun. 13, 2000

[54] NEGATIVE TYPE PHOTORESIST COMPOSITION USED FOR LIGHT BEAM WITH SHORT WAVELENGTH AND METHOD OF FORMING PATTERN USING THE SAME

[75] Inventors: Shigeyuki Iwasa; Katsumi Maeda; Kaichiro Nakano; Etsuo Hasegawa, all of Tokyo, Japan

[73] Assignee: NEC Corporation, Tokyo, Japan

[21] Appl. No.: 09/140,652

[22] Filed: Aug. 26, 1998

[30] Foreign Application Priority Data

Aug. 27, 1997 [JP] Japan .................................. 9-231344
Feb. 4, 1998 [JP] Japan .................................. 10-023206

[51] Int. Cl.$^7$ .................................................. G03F 7/038
[52] U.S. Cl. ........................ 430/270.1; 430/325; 430/908
[58] Field of Search ................................ 430/270.1, 325, 430/908

[56] References Cited

U.S. PATENT DOCUMENTS

| 5,650,262 | 7/1997 | Munzel et al. | 430/270.1 |
| 5,665,518 | 9/1997 | Maeda et al. | 430/270.1 |
| 5,817,444 | 10/1998 | Sato et al. | 430/155 |
| 5,916,729 | 6/1999 | Kobayashi et al. | 430/270.1 |
| 5,932,391 | 8/1999 | Ushirogouchi et al. | 430/270.1 |
| 5,985,522 | 11/1999 | Iwasa et al. | 430/315 |

FOREIGN PATENT DOCUMENTS

| 2-15270 | 1/1990 | Japan . |
| 2-27660 | 6/1990 | Japan . |
| 5-241342 | 9/1993 | Japan . |
| 6-138660 | 5/1994 | Japan . |
| 6-199770 | 7/1994 | Japan . |
| 7-28237 | 1/1995 | Japan . |
| 7-104473 | 4/1995 | Japan . |
| 7-128859 | 5/1995 | Japan . |
| 7-252324 | 10/1995 | Japan . |
| 8-27102 | 2/1996 | Japan . |
| 8-184965 | 7/1996 | Japan . |
| 8-211598 | 8/1996 | Japan . |
| 8-259626 | 8/1996 | Japan . |
| 8-240911 | 9/1996 | Japan . |
| 8-259626 | 10/1996 | Japan . |
| 9-127691 | 5/1997 | Japan . |
| 9-166868 | 6/1997 | Japan . |
| 9-221519 | 8/1997 | Japan . |
| 9-325484 | 12/1997 | Japan . |

OTHER PUBLICATIONS

Takumi Ueno et al., "Chemical Amplification Positive Resist Systems Using Novel Sulfonates as Acid Generators", *Sulfonates as Acid Generators*, PME '89, Kodansya, 1990, pp. 413–424.

F.M. Houlihan et al., "The Synthesis, Characterization and Lithography of α–Substituted 2–Nitrobenzyl Arylsulfonate Photo–Acid Generators with Improved Resistance to Post Exposure Bake", *SPIE*, vol. 2195, 1994, pp. 137–151.

J.V. Crivello et al., "New Photoinitiators For Cationic Polymerization", *Journal of the Polymer Science*, Symposium No. 56, 1976, pp. 383–395.

James V. Crivello et al., "A New Preparation of Triarylsulfonium and –selenonium Salts via the Copper(II)– Catalyzed Arylation of Sulfides and Selenides with Diaryliodonium Salts", *Journal of Organic Chemistry*, vol. 43, No. 15, 1978, pp. 3055–3058.

Satoshi Takechi et al., "Alicyclic Polymer for ArF and KrF Excimer Resist Based on Chemical Amplification", *Journal of Photopolymer Science and Technology*, vol. 5, No. 3, 1992, pp. 439–446.

R.D. Allen et al., "Resolution and Etch Resistance of a Family of 193 nm Positive Resists", *Journal of Photopolymer Science and Technology*, vol. 8, No. 4, 1995, pp. 623–636.

Katsumi Maeda et al., "Novel Alkaline–Soluble Alicyclic Polymer Poly(TCDMACOOH) for ArF Chemically Amplified Positive Resists", *SPIE*, vol. 2724, 1996, pp. 377–398.

James W. Thackeray et al., "Deep UV ANR Photoresists For 248 nm Excimer Laser Photolithography", *SPIE*, vol. 1086, 1989, pp. 34–47.

R.D. Allen et al., "Progress in 193 nm Positive Resists", *Journal of Photopolymer Science and Technology*, vol. 9, No. 3, 1996, pp. 465–474.

*Primary Examiner*—Janet Baxter
*Assistant Examiner*—Rosemary Ashton
*Attorney, Agent, or Firm*—Sughrue, Mion, Zinn, Macpeak & Seas, PLLC

[57] ABSTRACT

A negative type photoresist composition is composed of a polymer which contains a repetition unit which is expressed by a general chemical formula (1), a crosslinker composed of a compound which contains a functional group which is expressed by a general chemical formula (2), and a photo-acid generator which generates acid in response to a light. The chemical formula (1) is as follows,

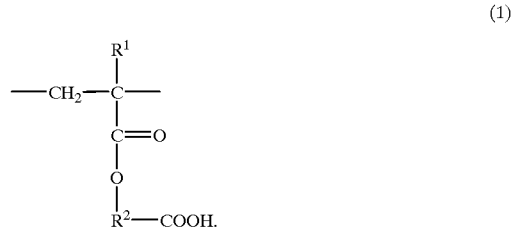

In this case, $R^1$ is a hydrogen atom or a methyl group, $R^2$ is an alkylene group containing carbon atoms in a range of 7 to 18 and having a bridged cyclic hydrocarbon group, and a weight average molecule weight of the polymer is in a range of 1000 to 500000. Also, the chemical formula (2) is as follows,

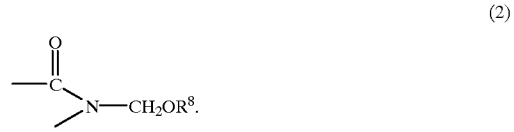

In this case, $R^8$ is a hydrogen atom, an alkyl group containing carbon atoms in a range of 1 to 6 or an oxoalkyl group containing carbon atoms in a range of 3 to 6.

28 Claims, 1 Drawing Sheet

000000
NEGATIVE TYPE PHOTORESIST COMPOSITION USED FOR LIGHT BEAM WITH SHORT WAVELENGTH AND METHOD OF FORMING PATTERN USING THE SAME

BACKGROUND OF THE INVENTION

1. Field of the Invention

The present invention relates to a photolithography process in a semiconductor device manufacturing process, and more particularly to a negative type photoresist composition suitable for a photolithography using a light with a short wavelength such as a light from an ArF excimer laser as an exposure light and a method of forming a pattern using the same.

2. Description of the Related Art

In the manufacturing field of various types of electronic devices among which a representative one is a semiconductor device, there is requirement of a higher density and a higher integration of devices. For this purpose, the fine processing of a half micron order is needed. Therefore, the requirement to photolithography technique for forming a fine pattern becomes increasingly more severe.

One method of forming such a fine pattern is to use a light having a shorter wavelength as an exposure light, when the pattern should be formed using a photoresist. For this purpose, the use of a KrF excimer laser as the exposure light is more positively studied at present for the mass production process of a 256-Mbit DRAM instead of the i line. The manufacture size of the 256-Mbit DRAM is equal to or less than 0.25 µm. The i line which is conventionally used has the wavelength of 365 nm, whereas the KrF excimer laser has the shorter wavelength of 248 nm.

However, a light source with a further shorter wavelength is necessary to manufacture a DRAM having a memory capacity equal to or more than 1 Gbits. The manufacture size of such a DRAM is equal to or less than 0.18 µm. Therefore, a further finer manufacture technique is required. For this reason, the use of an ArF excimer laser having the wavelength of 193 nm to the photolithography process is recently studied to satisfy the requirement. The photolithography using the excimer laser requires increase of cost performance of the laser, because the gas which is the raw materials of the laser oscillation has a short life, and the laser apparatus itself is expensive. Thus, the requirement of high sensitivity is present in addition to the high resolution such that the fine pattern forming process corresponding to the manufacture size can be accomplished.

As such a photoresist composition having high sensitivity, a chemically amplified type photoresist is well known which uses a photo-acid generator which is a sensitizer. In the features of the chemically amplified type photoresist, protonic acid is generated from the photo-acid generator contained in the photoresist through light irradiation of an exposure light. The protonic acid induces acid catalyst reaction to a base resin of the photoresist through heating processing after the exposure. Thus, the remarkably higher sensitivity is accomplished, compared with the conventional photoresist in which the photoreaction efficiency (that is, the reaction per a photon) is less than 1.

As a typical example of the chemically amplified type photoresist, a photoresist composed of a combination of triphenylsulfonium hexafluoloarsenate and poly(p-tert-butoxycarbonyloxy-α-methylstyrene) which is disclosed in Japanese Laid Open Patent Application (JP-A-Heisei 2-27660) is known as a positive-type photoresist. Also, a photoresist composed of a combination of polyvinylphenol and a melamine derivative is described in Proceeding of SPIE (Vol. 1086, 1989, pp. 34–47) by L. E. Bogan et al. as a negative type photoresist. The chemically amplified type photoresist is widely used as the photoresist for the KrF excimer laser at present for the high resolution and high sensitivity.

The resin which has a benzene ring such as novolak and polyvinylphenol has been used for the photoresist for the g line, the i line, and the KrF excimer laser. However, the resin which contains the benzene ring has very large light absorption of the light having the wavelength equal to or less than 220 nm such as the ArF excimer laser light. For this reason, if these photoresist compositions are used for the ArF excimer laser photolithography, most of the exposure light is absorbed in the photoresist surface. As a result, the laser light does not transmit to the substrate so that it is impossible to form a fine photoresist pattern. Therefore, the photoresist resin which has been used for the g line, the i line, and the KrF excimer laser cannot be applied to the photolithography in which the light with the shorter wavelength equal to or less than 220 nm is used just as it is.

On the other hand, the high etching durability which is necessarily required to the photoresist for a semiconductor manufacturing process is accomplished based on the benzene ring which is contained in the photoresist compositions for the g line, the i line, and the KrF excimer laser. Therefore, the photoresist for the ArF excimer laser needs to be material which has the etching durability without containing any benzene ring, and which has enough transparency to the light with wavelength equal to or less than 220 nm.

A positive type photoresist compositions having enough transparency to the ArF excimer laser with the wavelength of 193 nm and having the dry etching durability are studied for these several years. In the positive type photoresist, the resin containing an alicyclic group is used as base resin. For instance, a copolymer having adamantyl methacrylate unit by Takechi et al., ("Journal of Photopolymer Science and Technology", Vol. 5 (3), 1992, pp. 439–446), a copolymer having isobornyl methacrylate unit by R. D. Allen et al., ("Journal of Photopolymer Science and Technology", Vol. 8 (4), 1995, pp. 623–636, and Vol. 9 (3), 1996, pp. 465–474), and a copolymer having carboxylation tricyclodecyl methyl methacrylate unit by Maeda et al., ("SPIE Proceeding", Vol. 2724, 1996, pp. 377–398) are known.

As described above, the positive type photoresist is known for the photolithography in which the light with the short wavelength equal to or less than 220 nm is used. Such a lithography is represented by the ArF excimer laser photolithography. However, a negative type photoresist is not known. All of the conventional negative type photoresist compositions which are used for the g line, the i line, the KrF excimer laser cannot be applied to the photolithography in which the light with the shorter wavelength, just as it is. This is because a benzene ring is contained in the base resin, so that the light absorption of the light having the short wavelength equal to or less than 220 nm is too large, and most of the exposure light is absorbed in the photoresist surface.

SUMMARY OF THE INVENTION

The present invention is accomplished to solve the above problems. Therefore, an object of the present invention is to provide a negative type photoresist composition which can be used for the photolithography in which a light with the wavelength equal to or less than 220 nm such as the ArF laser is used as a light source beam, and which has enough etching durability.

Another object of the present invention is to provide a method of forming a photoresist pattern using the negative type photoresist composition.

In order to achieve an aspect of the present invention, a negative type photoresist composition includes a polymer which contains a repetition unit which is expressed by a general chemical formula (1), a crosslinker composed of a compound which contains a functional group which is expressed by a general chemical formula (2), and a photoacid generator which generates acid in response to a light. The general chemical formula (1) is as follows,

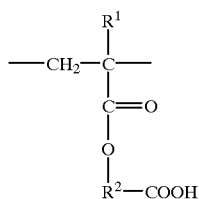

(1)

where in the general chemical formula (1), $R^1$ is a hydrogen atom or a methyl group, $R^2$ is an alkylene group containing carbon atoms in a range of 7 to 18 and having a bridged cyclic hydrocarbon group, and a weight average molecule weight of the polymer is in a range of 1000 to 500000. Also, the general chemical formula (2) is as follows,

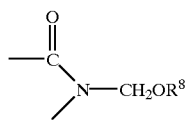

(2)

where in the general chemical formula (2), $R^8$ is a hydrogen atom, or an alkyl group containing carbon atoms in a range of 1 to 6 or an oxoalkyl group containing carbon atoms in a range of 3 to 6.

The negative type photoresist composition may further include a polyhydric alcohol compound.

Here, the above polymer is a linear polymer or a polymer having a branch, and contains the repetition unit which is expressed by the general chemical formula (1) at the main chain.

In the above negative type photoresist composition, the polymer may be a polymer which is expressed by a general chemical formula (3),

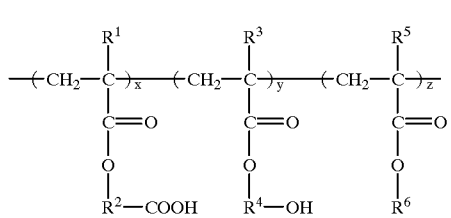

(3)

where in the general chemical formula (3), each of $R^1$, $R^3$ and $R^5$ is a hydrogen atom or a methyl group, each of $R^2$ and $R^4$ is an alkylene group containing carbon atoms in a range of 7 to 18 and having a bridged cyclic hydrocarbon group, $R^6$ is a hydrogen atom or an alkyl group containing carbon atoms in a range of 1 to 12, x, y and z satisfies x+y+z=1, 0<x<1, 0<y<1, and 0≦z<1, and a weight average molecule weight of the polymer is in a range of 1000 to 500000.

In the above negative type photoresist composition, the crosslinker may be a compound expressed by a general chemical formula (4),

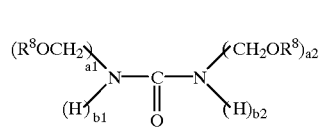

(4)

where in the general chemical formula (4), $R^8$ is a hydrogen atom, an alkyl group containing carbon atoms in a range of 1 to 6, or an oxoalkyl group containing carbon atoms in a range of 3 to 6, and a1=1 or 2, a2=1 or 2, b1=0 or 1, b2=0 or 1, a1+b1=2, and a2+b2=2.

Instead, the crosslinker may be a compound which is expressed by a general chemical formula (5),

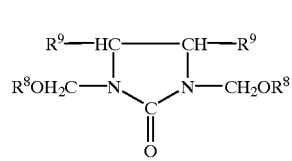

(5)

where in the general chemical formula (5), $R^8$ is a hydrogen atom, an alkyl group containing carbon atoms in a range of 1 to 6, or an oxoalkyl group containing carbon atoms in a range of 3 to 6, $R^9$ is a hydrogen atom, a hydroxyl group, an alkoxy group containing carbon atoms in a range of 1 to 6, or an oxoalkoxy group containing carbon atoms in a range of 3 to 6.

Also, instead, the crosslinker may be a compound which shown expressed by a general chemical formula (6),

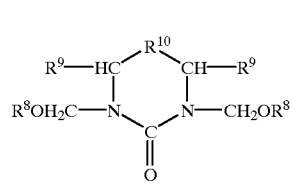

(6)

where in the general chemical formula (6), $R^8$ is a hydrogen atom, an alkyl group containing carbon atoms in a range of 1 to 6 or an oxoalkyl group containing carbon atoms in a range of 3 to 6, $R^9$ is a hydrogen atom, a hydroxyl group, or an alkoxy group containing carbon atoms in a range of 1 to 6, or an oxoalkoxy group containing carbon atoms in a range of 3 to 6, $R^{10}$ is an oxygen atom, a sulfur atom, an alkylene group containing carbon atoms in a range of 1–3, or a hydroxymethylene group.

In addition, the crosslinker may be a compound which is expressed by a general chemical formula (7),

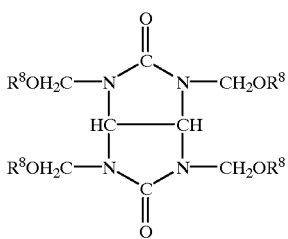

(7)

wherein in the general chemical formula (7), $R^8$ is a hydrogen atom, an alkyl group containing carbon atoms in a range of 1 to 6, or an oxoalkyl group containing carbon atoms in a range of 3 to 6.

Otherwise, the crosslinker may be a compound which is expressed by a general chemical formula (8),

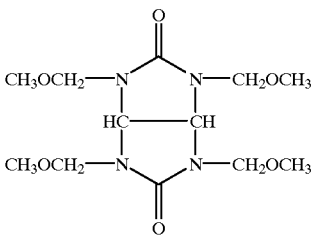

(8)

In the above negative type photoresist composition, the photo-acid generator may be a sulfonium salt compound which is expressed by a general chemical formula (9),

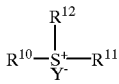

(9)

where in the general chemical formula (9), $R^{10}$, $R^{11}$ and $R^{12}$ are respectively independently alkyl substituted, halogen substituted or an aromatic group of non-substitution, an alicyclic group, an bridged cyclic hydrocarbon group, 2-oxoalicyclic group, or an alkyl group, and $Y^-$ is a counter anion expressed by $BF_4^-$, $AsF_6^-$, $SbF_6^-$ or a general chemical formula (10),

(10)

where in the general chemical formula (10), Z is $C_nF_{2n+1}$ (n is an integer in a range from 1 to 6), or an alkyl group, alkyl substituted, halogen substituted, or an aromatic group of non-substitution.

Instead, the photo-acid generator may be an iodonium salt compound which is expressed by a general chemical formula (11),

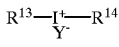

(11)

where in the general chemical formula (11), $R^{13}$ and $R^{14}$ are respectively independently alkyl substituted, halogen substituted, an aromatic group of non-substitution, an alicyclic group, a bridged cyclic hydrocarbon group, 2-oxoalicyclic group, or an alkyl group, and $Y^-$ is a counter anion expressed by $BF_4^-$, $AsF_6^-$, $SbF_6^-$, or a general chemical formula (10),

(10)

where in the general chemical formula (10), Z is $C_nF_{2n+1}$ (n is an integer in a range from 1 to 6), an alkyl group, alkyl substituted, halogen substituted or an aromatic group of non-substitution.

In addition, the photo-acid generator may be a succinimide derivative which is expressed by a general chemical formula (13),

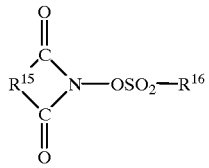

(12)

wherein in the general chemical formula (12), $R^{15}$ is halogen substituted, or an alkylene group of non-substitution, alkyl substituted, halogen substituted, or an aromatic group of non-substitution, $R^{16}$ is halogen substituted, an alkyl group of non-substitution, an alkyl group, halogen substituted or an aromatic group of non-substitution.

Otherwise, the photo-acid generator may be a diazo compound which is expressed by a general chemical formula (13),

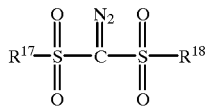

(13)

where in the general chemical formula (13), $R^{17}$ and $R^{18}$ are respectively independently an alkyl group, alkyl substituted, halogen substituted or an aromatic group of non-substitution, an alicyclic hydrocarbon group, or a bridged cyclic hydrocarbon group.

In the above negative type photoresist composition, it is desirable that the negative type photoresist composition contains the polymer of 50–98 weight percents, the crosslinker of 1–50 weight percents, and the photo-acid generator of 0.2–15 weight percents.

In order to achieve another aspect of the present invention, a method of forming a photoresist pattern, includes the steps of:

applying either one of the negative type photoresist composition described above on a substrate;

exposing the negative type photoresist composition by a light with a wavelength of 180 to 220 nm;

performing baking of the substrate on which the negative type photoresist composition is applied; and performing development of the baked substrate.

The light with the wavelength of 180 nm to 220 nm is an ArF excimer laser light.

DESCRIPTION OF THE PREFERRED EMBODIMENTS

Figure 1A:
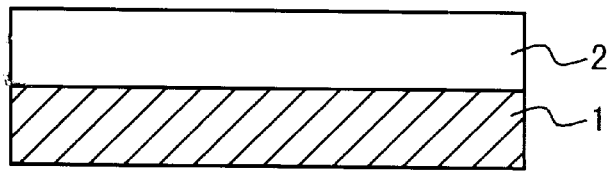
FIGS. 1A to 1D are diagrams illustrating a method of forming a photoresist pattern in the present invention.

The negative type photoresist composition of the present invention will be described below in detail.

A negative type photoresist composition of the present invention includes a polymer which contains a repetition unit which is expressed by a general chemical formula (1), a crosslinker composed of a compound which contains a functional group which is expressed by a general chemical formula (2), and a photo-acid generator which generates acid in response to a light. The general chemical formula (1) is as follows,

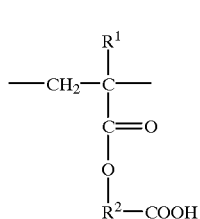
(1)

where in the general chemical formula (1), $R^1$ is a hydrogen atom or a methyl group, $R^2$ is an alkylene group containing carbon atoms in a range of 7 to 18 and having a bridged cyclic hydrocarbon group, and a weight average molecule weight of the polymer is in a range of 1000 to 500000. Also, the general chemical formula (2) is as follows,

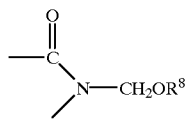
(2)

where in the general chemical formula (2), $R^8$ is a hydrogen atom, or an alkyl group containing carbon atoms in a range of 1 to 6 or an oxoalkyl group containing carbon atoms in a range of 3 to 6. Here, the above polymer is a linear polymer or a polymer having a branch, and contains the repetition unit which is expressed by the general chemical formula (1) at the main chain.

The negative type photoresist composition may further include a polyhydric alcohol compound.

The polymer may be a polymer which is expressed by a general chemical formula (3),

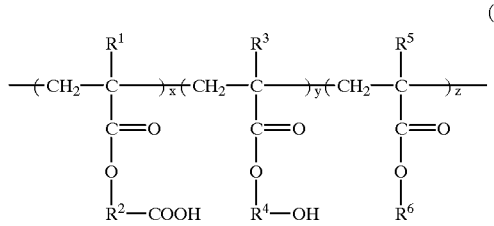
(3)

where in the general chemical formula (3), each of $R^1$, $R^3$ and $R^5$ is a hydrogen atom or a methyl group, each of $R^2$ and $R^4$ is an alkylene group containing carbon atoms in a range of 7 to 18 and having a bridged cyclic hydrocarbon group, $R^6$ is a hydrogen atom or an alkyl group containing carbon atoms in a range of 1 to 12, x, y and z satisfies x+y+z=1, 0<x<1, 0<y<1, and 0≦z<1, and a weight average molecule weight of the polymer is in a range of 1000 to 500000.

As the alkylene group containing carbon atoms in a range of 7 to 18 and having a bridged cyclic hydrocarbon group, which is indicated by $R^2$ in the general chemical formula (1), there are a tricyclo[5.2.1.0$^{2,6}$]decylmethylene group, a tricyclo[5.2.1.0$^{2,6}$]decane-diyl group, an adamantane-diyl group, a norbornane-diyl group, a methylnorbornane-diyl group, an isobornane-diyl group, a tetracyclo[4.4.0.1$^{2,5}$.1$^{7,10}$]dodecane-diyl group, a methyltetracyclo[4.4.0.12,5.17,10]dodecane-diyl group, a hexacyclo[6.6.1.1$^{3,6}$.1$^{10,13}$.0$^{2,7}$.0$^{9,14}$]heptadecane-diyl group, a methylhexacyclo[6.6.1.1$^{3,6}$.1$^{10,13}$.0$^{2,7}$.0$^{9,14}$]heptadecane-diyl group, as shown in a table 1. However, such an alkylene group is not limited to them.

TABLE 1

$R^2$ tricyclo[5.2.1.0$^{2,6}$] decylmethylene group,

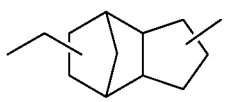

or

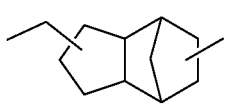

a tricyclo[5.2.1.0$^{2,6}$] decane-diyl group,

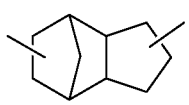

or

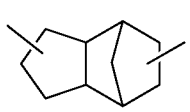

an adamantane-diyl group,

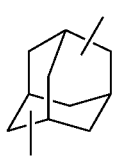

a norbornane-diyl group,

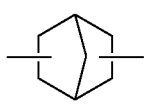

a methylnorbornane-diyl group,

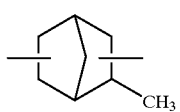

TABLE 1-continued

R² an isobornane-diyl group,

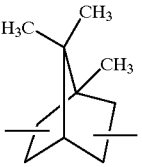

a tetracyclo[4.4.0.1²,⁵.1⁷,¹⁰]dodecane-diyl group,

a methyltetracyclo[4.4.0.1²,⁵.1⁷,¹⁰]dodecane-diyl group,

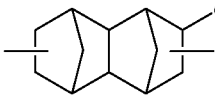

a hexacyclo[6.6.1.1³,⁶.1¹⁰,¹³.0²,⁷.0⁹,¹⁴]heptadecane-diyl group,

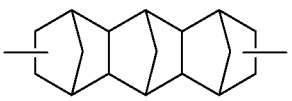

a methylhexacyclo[6.6.1.1³,⁶.1¹⁰,¹³.0²,⁷.0⁹,¹⁴]heptadecane-diyl group,

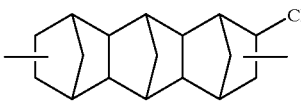

In the present invention, the compound which is expressed by the following general chemical formula (4), general chemical formula (5), general chemical formula (6) or general chemical formula (7) can be used as the crosslinker.

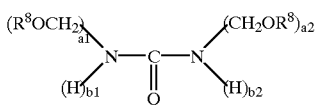
(4)

where in the general chemical formula (4), $R^8$ is a hydrogen atom or an alkyl group containing carbon atoms in a range of 1 to 6 (more specifically, a methyl group, an ethyl group, a propyl group, an isopropyl group, a butyl group, an isobutyl group, a tertiary butyl group, a pentyl group, and a hexyl group, but not limited to them), an oxoalkyl group containing carbon atoms in a range of 3 to 6 (more specifically, a β-oxopropyl group, a β-oxobutyl group, a β-oxoheptyl group, and a β-oxohexyl group, but not limited to them), a1=1 or 2, a2=1 or 2, b1=0 or 1, b2=0 or 1, a1+b1=2, and a2+b2=2.

The chemical formula (5) is as follows,

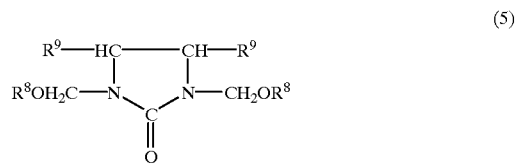
(5)

where in the general chemical formula (5), $R^8$ is a hydrogen atom or an alkyl group containing carbon atoms in a range of 1 to 6 (more specifically, a methyl group, an ethyl group, a propyl group, an isopropyl group, a butyl group, an isobutyl group, a tertiary butyl group, a pentyl group, and a hexyl group, but not limited to them), or an oxoalkyl group containing carbon atoms in a range of 3 to 6 (more specifically, a β-oxopropyl group, a β-oxobutyl group, a β-oxoheptyl group, and a β-oxohexyl group, but not limited to them), $R^9$ is a hydrogen atom, a hydroxyl group or an alkoxy group containing carbon atoms in a range of 1 to 6 (more specifically, a methoxy group, an ethoxy group, an propyloxy group, an isopropyloxy group, a butoxy group, an isobutoxy group, a tertiary butoxy group, a pentyloxy group, and a hexyloxy group, but not limited to them), or an oxoalkoxy group containing carbon atoms in a range of 3 to 6 (more specifically, a β-oxopropoxy group, a β-oxobutoxy group, a β-oxoheptyloxy group, a β-oxohexyloxy group, but not limited to them).

The chemical formula (6) is as follows,

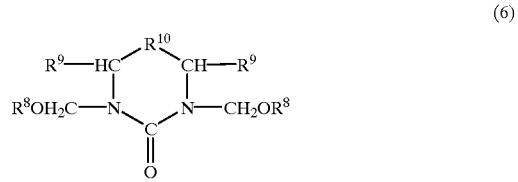
(6)

where in the general chemical formula (6), $R^8$ is a hydrogen atom or an alkyl group containing carbon atoms in a range of 1 to 6 (more specifically, a methyl group, an ethyl group, a propyl group, an isopropyl group, a butyl group, an isobutyl group, a tertiary butyl group, a pentyl group, and a hexyl group, but not limited to them), or an oxoalkyl group containing carbon atoms in a range of 3 to 6 (more specifically, a β-oxopropyl group, a β-oxobutyl group, a β-oxoheptyl group, and a β-oxohexyl group, but not limited to them), $R^9$ is a hydrogen atom, a hydroxyl group or an alkoxy group containing carbon atoms in a range of 1 to 6 (more specifically, a methoxy group, an ethoxy group, an propyloxy group, an isopropyloxy group, a butoxy group, an isobutoxy group, a tertiary butoxy group, a pentyloxy group, and a hexyloxy group, but not limited to them), or an oxoalkoxy group containing carbon atoms in a range of 3 to 6 (more specifically, a β-oxopropoxy group, a β-oxobutoxy group, a β-oxoheptyloxy group, a β-oxohexyloxy group, but not limited to them), and $R^{10}$ is an oxygen atom, a sulfur atom, an alkylene group containing carbon atoms in a range of 1 to 3 (more specifically, a methylene group, an ethylene group, a propylene group, and a 1-methylethylene group, but not limited to them) or a hydroxymethylene group.

The chemical formula (7) is as follows,

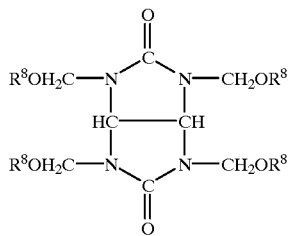
(7)

where in the general chemical formula (7), $R^8$ is a hydrogen atom or an alkyl group containing carbon atoms in a range of 1 to 6 (more specifically, a methyl group, an ethyl group, a propyl group, an isopropyl group, a butyl group, an isobutyl group, a tertiary butyl group, a pentyl group, and a hexyl group, but not limited to them), or an oxoalkyl group containing carbon atoms in a range of 3 to 6 (more specifically, a β-oxopropyl group, a β-oxobutyl group, a β-oxoheptyl group, and a β-oxohexyl group, but not limited to them).

The carboxyl group of the polymer which is expressed by the general chemical formula (1) of the photoresist composition of the present invention has the property to combine with a group of the crosslinker compound which is expressed by the general chemical formula (2) under the existence of acid catalyst, as shown in the following reaction formula (A).

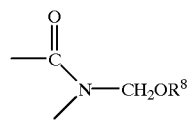
(2)

where in the general chemical formula (2), $R^8$ is a hydrogen atom, an alkyl group containing carbon atoms in a range of 1 to 6 or an oxoalkyl group containing carbon atoms in a range of 3 to 6.). The reaction equation (A) is as follows, reaction equation (A)

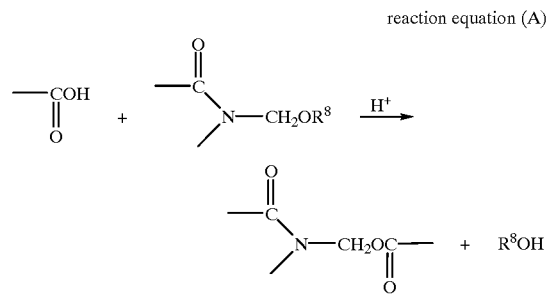

The compound which is expressed by the general chemical formula (4), the general chemical formula (5), the general chemical formula (6) or the general chemical formula (7) has two or more groups which are expressed by the general chemical formula (2), i.e., the groups reactable with carboxylic acid and one molecule of the compound can combine with the polymer of 2 or more molecules. The compound which is expressed by the general chemical formula (4), the general chemical formula (5), the general chemical formula (6) or the general chemical formula (7) performs bridging between the polymers under the existence of acid catalyst. Because the polymer has a carboxyl group, the polymer is soluble to alkaline developer. However, when the bridging is performed to form a three-dimensional reticular structure, the polymer does not solve to the alkaline developer.

Thus, the photoresist composition of the present invention composed of the polymer which contains the repetition unit which is expressed by the general chemical formula (1), the compound which is expressed by the general chemical formula (4), the general chemical formula (5), the general chemical formula (6) or the general chemical formula (7), and the photo-acid generator is applied to form a thin film. Then, the photoresist thin film is exposed by a deep UV light such as the ArF excimer laser light. At this time, acid is generated from the photo-acid generator in the exposed area. When heating is performed, the bridging is performed between the polymers because the acid functions as a catalyst. As a result, the exposed area becomes insoluble to the developer. In this manner, a negative type pattern can be obtained.

As the polymer for the negative type photoresist composition of the present invention, the polymer which is expressed by the general chemical formula (3), in other words, the polymer in which the repetition unit which is expressed by a general chemical formula (1) and an alicyclic group unit containing the hydroxyl group are combined is also very effective, in addition to the polymer which contains the repetition unit which is expressed by the general chemical formula (1). This is because the hydroxyl group is also possible to combine with the group which is expressed by a general chemical formula (2) under the existence of the acid catalyst, as show by the following reaction formula (B).

Also, the negative type photoresist composition composed of the polymer which is expressed by the general chemical formula (3), the compound which is expressed by the general chemical formula (4), the general chemical formula (5), the general chemical formula (6) or the general chemical formula (7), and the photo-acid generator which generates acid by the exposure has a high transparency to the light with the short wavelength of equal to or less than 220 nm such as the ArF excimer laser light and high dry etching durability.

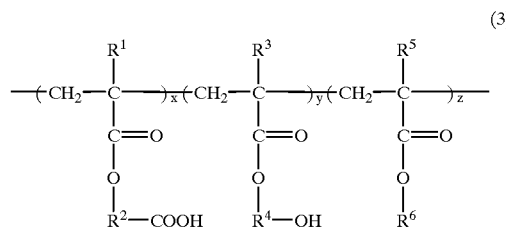
(3)

where in the general chemical formula (3), $R^1$, $R^3$ and $R^5$ are a hydrogen atom or a methyl group, $R^2$ and $R^4$ are an alkylene group containing carbon atoms in a range of 7 to 18 and having a bridged cyclic hydrocarbon group (more specifically, as shown in the table 1, a tricyclo[$5.2.1.0^{2,6}$] decylmethylene group, a tricyclo[$5.2.1.0^{2,6}$]decane-diyl group, an adamantane-diyl group, a norbornane-diyl group, a methylnorbornane-diyl group, an isobornane-diyl group, a tetracyclo[$4.4.0.1^{2,5}.1^{7,10}$]dodecane-diyl group, a methyltetracyclo[$4.4.0.1^{2,5}.1^{7,10}$]dodecane-diyl group, a hexacyclo[$6.6.1.1^{3,6}.1^{10,13}.0^{2,7}.0^{9,14}$]heptadecane-diyl group, a methylhexacyclo[$6.6.1.1^{3,6}.1^{10,13}.0^{2,7}.0^{9,14}$] heptadecane-diyl group, but not limited to them), $R^6$ is a hydrogen atom or an alkyl group containing carbon atoms in a range of 1 to 12 of carbon (more specifically, a methyl group, an ethyl group, a propyl group, a butyl group, a pentyl group, a hexyl group, a heptyl group, an octyl group, a cyclopentyl group, a cyclohexyl group, a tricyclo[5.2.1.0$^{2,6}$]decyl group, an adamantyl group, a norbornyl group, a tetracyclo[4.4.0.1$^{2,5}$.1$^{7,10}$]dodecyl group, but not limited to them), x, y and z are the ratios of the repetition units and satisfy x+y+z=1, 0<x≦1, 0<y<1, and 0≦z<1, and the weight average molecule weight of the polymer is in a range of 1000 to 500000.

reaction equation (B)

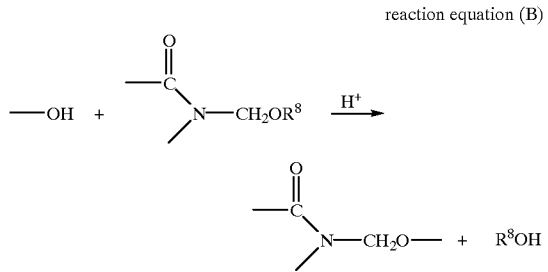

The negative type photoresist composition of the present invention uses as a base resin the polymer which has an alicyclic group by which it is possible to obtained high dry etching durability. Also, because the polymer does not have a benzene ring, the polymer has a high transparency to the light with the short wavelength equal to or less than 220 nm such as an ArF excimer laser light of 193.4 nm. In other words, the photoresist composition of the present invention is a chemically amplified type photoresist, and has both of the high transparency to the light with the short wavelength equal to or less than 220 nm such as the ArF excimer laser light and high dry etching durability.

The polymer which is expressed by the general chemical formula (1) or (3) in the negative type photoresist composition of the present invention is possible to obtain by the method described in Japanese Laid Open Patent Application (JP-A-Heisei 8-259626). More specifically, the polymer can be obtained by adding a suitable radical polymerization initiator, for example, azobisisobutyronitrile (AIBN) in the dried tetrahydrofuran under the ambience of an inactive gas such as an argon gas and a nitrogen gas, and by stirring and heating for 0.5 to 12 hours at the temperature of 50 to 70° C. When the copolymerization ratio of the polymers which is expressed by the general chemical formula (3) is selected with respect to a monomer addition ratio and other polymerization conditions, an optional copolymer can be obtained.

Also, the weight average molecule weight of the polymer in the negative type photoresist composition of the present invention is in a range of 1000 to 500000, and more desirably is in a range of 5000 to 200000. This is because the glass transition point of the polymer becomes low so that it is difficult to handle as the photoresist, when the molecular weight is less than 1000, and also, it is difficult to form a uniform film on a substrate when the molecular weight is equal to or more than 500000.

When the crosslinker in the negative type photoresist composition of the present invention is the compound expressed by the general chemical formula (4), the compound can be synthesized by methylolating urea with formaldehyde in case that the compound is methylol urea in which R$^8$ in the general chemical formula (4) is a hydrogen atom. Also, the compound can be obtained by processing it with corresponding alcohol in case that R$^8$ in the general chemical formula (4) is an alkyl group or an oxoalkyl group. For instance, dimethoxymethyl urea (R$^8$ is a methyl group (an alkyl group containing one carbon atom) in the general chemical formula (4)) can be obtained by the processing with methanol, and diethoxymethyl urea (R$^8$ is an ethyl group (an alkyl group containing two carbon atoms) in the general chemical formula (4)) can be obtained by processing with ethanol. Also, diisobutoxymethyl urea (R$^8$ is an isobutyl group (an alkyl group containing four carbon atoms) in the general chemical formula (4)) can be obtained by processing with isobutanol, and di-β-oxopropylmethyl urea (R$^8$ is a β-oxopropyl group (an oxoalkyl group containing three carbon atoms) in the general chemical formula (4)) can be obtained by processing with 2-oxopropanol (it is also called hydroxyacetone).

When the compound which is expressed by the general chemical formula (5) is 1,3-bis(hydroxymethyl) ethyleneurea (it is also called 1,3-dimethylolimidazolidone-2) in which R$^8$ is a hydrogen atom and R$^9$ is a hydrogen atom in the general chemical formula (5), for example, the compound can be obtained by reacting urea with ethylene diamine and formaldehyde. Also, in case that R$^8$ is an alkyl group or an oxoalkyl group and R$^9$ is a hydrogen atom in the general chemical formula (5), the compound can be obtained by processing 1,3-bis(hydroxymethyl)ethyleneurea with corresponding alcohol. For instance, 1,3-bis (methoxymethyl)ethyleneurea (R$^8$ is a methyl group (an alkyl group containing one carbon atom), R$^9$ is a hydrogen atom in the general chemical formula (5)) can be obtained by processing with methanol, and 1,3-bis(ethoxymethyl) ethyleneurea (R$^8$ is an ethyl group (an alkyl group containing 2 carbon atoms) and R$^9$ is a hydrogen atom in the general chemical formula (5)) can be obtained by processing with ethanol. Also, 1,3-bis(isobutoxymethyl)ethyleneurea (R$^8$ is an isobutyl group (an alkyl group containing 4 carbon atoms) in the general chemical formula (5)) can be obtained by processing with isobutanol, and 1,3-bis(β-oxopropoxymethyl)ethyleneurea (R$^8$ is a 2-oxopropyl group (an oxoalkyl group containing 3 carbon atoms) in the general chemical formula (5)) can be obtained by processing with 2-oxopropanol (it is also called hydroxyacetone.).

Also, in case of 1,3-bis(hydroxymethyl)-4,5-bis(hydroxy) ethyleneurea (it is also called 1,3-dimethylol-4,5-dihydroxyimidazolidone-2) in which R$^8$ is a hydrogen atom and R$^9$ is a hydroxyl group in the general chemical formula (5), the compound can be synthesized by reacting urea with glyoxasol and then by methylolating with formaldehyde. Also, the compound can be obtained by processing 1,3-bis (hydroxymethyl)-4,5-bis(hydroxy)ethyleneurea with corresponding alcohol when R$^8$ is an alkyl group or an oxoalkyl group, R$^9$ is an alkoxy group or an oxoalkoxy group in the general chemical formula (5). For instance, 1,3-bis (methoxymethyl)-4,5-bis(methoxy)ethyleneurea (R$^8$ is an methyl group (an alkyl group containing one carbon atom) and R$^9$ is a methoxy group (an alkoxy group containing one carbon atom) in the general chemical formula (5)) can be obtained by processing with methanol, and 1,3-bis (ethoxymethyl)-4,5-bis(ethoxy)ethyleneurea (an ethyl group (an alkyl group containing 2 carbon atoms) and R$^9$ is an ethoxy group (an alkoxy group containing 2 carbon atoms) in the general chemical formula (5)) can be obtained by processing with ethanol. Also, 1,3-bis(isopropoxymethyl)-4,5-bis(isopropoxy)ethyleneurea (R$^8$ is the isopropyl group (an alkyl group containing 3 carbon atoms) and R$^9$ is a propyloxy group in the general chemical formula (5)) can be obtained by processing with isopropanol, 1,3-bis (tertialbutoxymethyl)-4,5-bis(tertialbutoxy)ethyleneurea ($R^8$ is a tertiary butyl group (an alkyl group containing 4 carbon atoms) and $R^9$ is a tertiary butoxy group (an alkoxy group containing 4 carbon atoms) in the general chemical formula (5)) can be obtained by processing with tertiary butanol, and 1,3-bis(β-oxopropoxymethyl)-4,5-bis(β-oxopropoxy)ethyleneurea ($R^8$ is β-oxopropoxy group (an oxoalkyl group containing 3 carbon atoms) and $R^9$ is β-oxopropoxy group (an oxoalkoxy group containing 3 carbon atoms) in the general chemical formula (5)) can be obtained by processing with 2-oxopropanol (it is also called hydroxyacetone).

Also, in case of 1,3-bis(hydroxymethyl)-tetrahydro-2(1H) pyrimidinone ($R^8$ is a hydrogen atom and $R^9$ is a methylene group in the general chemical formula (6)), the compound which is expressed by the general chemical formula (6) can be obtained by reacting urea with propylene diamine and then by further reacting with formaldehyde.

Also, when $R^8$ is an alkyl group and $R^9$ is a methylene group in the general chemical formula (6), the compound can be obtained by processing 1,3-bis(hydroxymethyl)-tetrahydro- 2(1H)pyrimidinone with corresponding alcohol. For instance, dimethylated 1, 3-bis(hydroxymethyl)-tetrahydro-2(1H)pyrimidinone ($R^8$ is a methyl group (an alkyl group 2 carbon atoms) and $R^9$ is a hydrogen atom of a methylene group (an alkylene group containing 1 carbon atom) in the general chemical formula (6)) can be obtained by processing with methanol, and diethylated 1,3-bis(hydroxymethyl)-tetrahydro-2(1H)pyrimidinone ($R^8$ is an ethyl group (an alkyl group containing 2 carbon atoms) and $R^9$ is a hydrogen atom of a methylene group (an alkylene group containing 1 carbon atom) in the general chemical formula (4)) can be obtained by processing with ethanol. Also, butylated 1, 3-bis(hydroxymethyl)-tetrahydro-2(1H) pyrimidinone (an isobutyl group (an alkyl group containing 4 carbon atoms) and $R^9$ is hydrogen atom of a methylene group (an alkylene group containing 1 carbon atom) in the general chemical formula (6)) can be obtained by processing with isobutanol.

Also, dimethylol uron (in the general chemical formula (6), $R^8$ is a hydrogen atom and $R^9$ is an oxygen atom) can be obtained by reacting urea with formaldehyde of 4 times of moles of urea. Also, 1,3-bis(hydroxymethyl)-tetrahydro-5-hydroxy-2(H)pyrimidinone (in the general chemical formula (6), $R^8$ is a hydrogen atom and $R^9$ is a hydroxymethylene group) can be obtained by reacting urea with 2-hydroxypropylene diamine and moreover by reacting with formaldehyde.

Also, 1,3,4,6-tetrakis(hydroxymethyl)glycoluril (it is also call 1,3,4,6-tetrakis(hydroxymethyl)acetylenurea, tetramethylol glyoxal diurein) ($R^8$ is a hydrogen atom in the general chemical formula (7)) can be obtained as the compound which is expressed by the general chemical formula (7) by reacting glyoxasol with urea of twice of mole of glyoxasol and moreover by methylolating with formaldehyde.

Also, when $R^8$ is an alkyl group or an oxoalkyl group in the general chemical formula (7), the compound can be obtained by processing 1,3,4,6-tetrakis(hydroxymethyl) glycoluril with corresponding alcohol. For instance, 1,3,4, 6-tetrakis(methoxymethyl)glycoluril which is expressed by the following general chemical formula (8) is obtained, by processing with methanol. It should be noted that this compound corresponds to the compound in which $R^8$ is replaced by a methyl group (an alkyl group containing 1 carbon atom) in the general chemical formula (7).

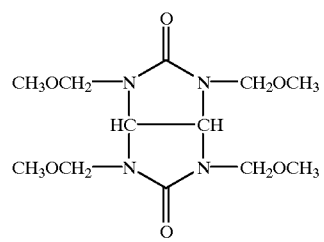

(8)

Also, 1,3,4,6-tetrakis(ethoxymethyl)glycoluril ($R^8$ is an ethyl group (an alkyl group containing 2 carbon atoms) in the general chemical formula (7)) can be obtained by processing with ethanol, 1,3,4,6-tetrakis(isobutoxymethyl) glycoluril ($R^8$ is an isobutyl group (an alkyl group containing 4 carbon atoms) in the general chemical formula (7)) can be obtained by processing with isobutanol, and 1,3,4,6-tetrakis(β-oxopropoxymethyl)glycoluril ($R^8$ is β-oxopropyl group (an oxoalkyl group containing 3 carbon atoms) in the general chemical formula (7)) can be obtained by processing by 2-oxopropanol (it is also called hydroxyacetone).

The photo-acid generator of the photoresist composition of the present invention is desirable to generate acid through the irradiation of a light with the wavelength of 180 nm to 220 nm. Also, it is necessary that a mixture with the above-mentioned polymer of the photoresist composition of the present invention is sufficiently soluble to organic solvent so that a uniform film can be formed from the solution by a film forming method such as a spin coating method. If these conditions are satisfied, any kind of photo-acid generator can be used. Also, a single type of photo-acid generator may be used or mixture of 2 or more kinds of photo-acid generators may be used.

As an example of the practicable photo-acid generator, there can be used sulfonium salt compound which is expressed by the following general chemical formula (9), iodonium salt compound which is expressed by the following general chemical formula (11), succinimide derivative which is expressed by the following general chemical formula (12), diazo compound which is expressed by the following general chemical formula (13), 2,6-dinitrobenzyl ester, disulfon compound and so on.

As the examples of them, there are known triphenylsulfonium salt derivative by J. V. Crivello et al., (Journal of the Organic Chemistry, Vol. 43, No. 15, 1978, pp. 3055 to 3058), diphenyliodonium salt derivative by J. V. Crivello et al., (Journal of the Polymer Science, Vol. 56, 1976, pp. 383 to 395), alkylsulfonium salt deribative such as cyclohexylmethyl (2-oxocyclohexyl) sulfonium trifluoromethanesulfonate described in Japanese Laid Open Patent Application (JP-A-Heisei 7-28237), and sulfonium salt compound having a bridged cyclic alkyl group such as β-oxocyclohexylmethyl (2-norbornyl) sulfonium trifluoromethanesulfonate described in Japanese Laid Open Patent Application (JP-A-Heisei 8-27102). Also, in addition, there are known 2-nitrobenzyl ester by F. M. Houlihan et al., (SPIE proceeding, Vol. 2195, 1994, p. 137), 1,2,3-tri (methansulfonyloxy)benzen by Takumi Ueno et al., (proceeding of PME '89, Kodansya, 1990, pp. 413 to 424, disulfonium salt compound and so on.

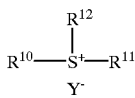
(9)

where in the general chemical formula (9), $R^{10}$, $R^{11}$ and $R^{12}$ are respectively independently alkyl substituted, halogen substituted or an aromatic group of non-substitution, an alicyclic group, a bridged cyclic hydrocarbon group, a 2-oxoalicyclic group, or an alkyl group, and $Y^-$ is a counter anion expressed by $BF_4^-$, $AsF_6^-$, $SbF_6^-$ or the general chemical formula (10).

(10)

where in the general chemical formula (10), Z is $C_nF_{2n+1}$ (n is an integer from 1 to 6), an alkyl group, alkyl substituted, halogen substituted or an aromatic group of non-substitution.

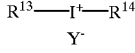
(11)

where in the general chemical formula (11), $R^{13}$ and $R^{14}$ are respectively independently an alkyl group, halogen substituted or aromatic group of non-substitution, an alicyclic group, a bridged cyclic hydrocarbon group, a 2-oxoalicyclic group, or an alkyl group, and $Y^-$ is a counter anion expressed by $BF_4^-$, $AsF_6^-$, $SbF_6^-$ or the general chemical formula (10)

(10)

where in the general chemical formula (10), Z is $C_nF_{2n+1}$ (n is an integer from 1 to 6), an alkyl group, alkyl substituted, halogen substituted or an aromatic group of non-substitution.

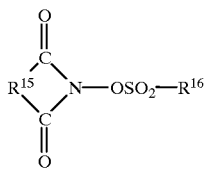
(12)

where in the general chemical formula (12), $R^{15}$ is halogen substituted, an alkyl group of non-substitution, alkyl substituted, halogen substituted or an aromatic group of non-substitution with 2 valences, and $R^{16}$ is halogen substituted, or an alkyl group of non-substitution, an alkyl group, a halogen substituted or an aromatic group of non-substitution.

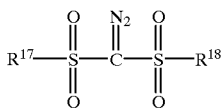
(13)

where in the general chemical formula (13), $R^{17}$ and $R^{18}$ are respectively independently an alkyl group, an alkyl, halogen substituted or an aromatic group of non-substitution, an alkyl group, an alicyclic hydrocarbon group, or a bridged cyclic hydrocarbon group.

Also, when the negative type photoresist composition of the present invention contains polyhydric alcohol (alcohol with equal to or more than 2 valences), resolution can be sometimes improved. This is because the polyhydric alcohol has high reactivity with the crosslinker so that the polyhydric alcohol acts as an accelerator of bridging. As the polyhydric alcohol used in the present invention, there are ethylene glycol, glycerol, 1,2-butanediol, 1,3-butanediol, 1,4-butanediol, 2,3-butanediol, 1,2,4-butanediol, 1,2-pentanediol, 1,4-pentanediol, 1,5-pentanediol, 2,4-pentanediol, 1,2-hexanediol, 1,5-hexanediol, 1,6-hexanediol, 2,5-hexanediol, 1,2-cyclohexanediol, 1,3-cyclohexanediol, 1,4-cyclohexanediol, 1,2-cyclohexanedimethanol, 1,4-cylcohexanedimethanol, 1,3,5-cyclohexanetrimethanol, 1,2-cyclopentanediol, 1,3-cyclopentanediol, 1,2-cyclooctanediol, 1,5-cyclooctanediol, tricyclodecanedimethanol, 2,3-norbornanediol, 2(3)-hydroxy-5,6-bis(hydroxymethyl)norbornane, 2,3-dihydroxy-5(6)-hydroxymethylnorbornane, 1-4-anhydroerithriol, L-arabinose, L-arabitol, D-cellobiose, cellulose, 1,5-decalindiol, glucose, galactose, lactose, maltose, mannose, and mannitol. However, the polyhydric alcohol is not limited to them.

The containing percentage of the polymer which contains the repetition unit expressed by the general chemical formula (1) or the polymer which is expressed by the general chemical formula (3) in the negative type photoresist composition of the present invention is the weight percent of 50 to 98, desirably, the weight percent from 70 to 95 in case of 100 weight percents including the polymer. When the containing percentage of the polymer is less than 50 weight percent, it is difficult to form a uniform film. Also, when the containing percentage of the polymer is at equal to or more than 98 weight percent, the quantity of the crosslinker (compound which is expressed by either of the general chemical formula (4) to the general chemical formula (7)) and the quantity of the photo-acid generator which can be introduced becomes necessarily less. As a result, the bridging cannot be sufficiently accomplished so that a pattern is not obtained.

Also, the containing percentage of the crosslinker (compound which is expressed by either of the general chemical formula (4) to the general chemical formula (7)) is the weight percent of 1 to 50, desirably, the weight percent from 10 to 30 in case of 100 weight percents including the crosslinker. When the containing percentage of the polymer is less than 1 weight percent, the bridging for the polymerization is not sufficiently accomplished. As a result, a pattern is not obtained. Also, the containing percentage of the polymer is equal to or more than 50 weight percent, it is difficult to form a uniform film and the transparency of the film sometimes decreases. Moreover, the containing percentage of the polymer is also insufficient so that sometimes enough etching durability cannot be accomplished.

Also, the containing percentage of the photo-acid generator is the weight percents of 0.2 to 15, desirably the weight percent of 0.5 to 10 in case of 100 weight percents including the photo-acid generator. When the containing percentage of the photo-acid generator is less than 0.2 weight percent, the sensitivity of the negative type photoresist composition of the present invention decreases remarkably. Therefore, in this containing percentage, it is difficult to form a pattern. Also, when the containing percentage of the photo-acid generator is beyond 15 weight percent, there are problems in that the formation of a uniform application film becomes difficult, and it becomes easy for scum to be generated after development.

Also, in case that the negative type photoresist composition of the present invention contain polyhydric alcohol, when the containing percentage of the polyhydric alcohol is the weight percent of 0.2 to 20, in case of 100 weight percents including the polyhydric alcohol, improvement of resolution is accomplished.

Organic solvent in which the negative type photoresist composition of the present invention can be dissolved sufficiently and to which a method such as a spin coating method can be applied such that a uniform application film can be formed is desirable as solvent to be used for a present invention. If the above conditions are satisfied, any kind of solvent can be used. Also, a single kind of solvent or more than 2 kinds of solvent may be used. Specifically, there are n-propyl alcohol, isopropyl alcohol, n-butyl alcohol, tert-butyl alcohol, methyl cellosolve acetate, ethyl cellosolve acetate, propyleneglycol monoethyl ether acetate (1-methoxy-2-acetoxypropane), methyl lactate, ethyl lactate, 2-methoxybutyl acetate, 2-ethoxyethyl acetate, methyl pyruvate, ethyl pyruvate, methyl 3-methoxypropionate, ethyl 3-methoxypropionate, N-methyl-2-pirrolidinone, cyclohexanone, cyclopentanone, cyclohexanol, Methyl ethyl ketone, 1,4-dioxane, ethylene glycol monomethyl ether, ethylene glycol monomethyl ether acetate, ethylene glycol monoethyl ether, ethylene glycol monoethyl ether acetate, ethylene glycol monoisopropyl ether, diethylene glycol monomethyl ether, and diethylene glycol dimethyl ether. However, the solvent is not limited to them, of course.

Also, the photoresist composition of the present invention may be added with the other ingredients such as a surface-active agent, a pigment, a stabilizing agent, an applicability improving agent, a dyestuff in accordance with necessity. Also, the present invention provides a method of forming a negative type photoresist pattern on a substrate to be processed using the above negative type photoresist material.

A method of forming a negative type photoresist pattern of the present invention is shown in FIGS. 1A to 1D. First, as shown in FIG. 1A, the negative type photoresist material of the present invention is applied onto a substrate 1 to be processed. Then, a pre-baking process is performed by heating means such as a hot plate at the temperature of 60 to 170° C. for 30 to 240 seconds to form a photoresist film 2.

Figure 1B:
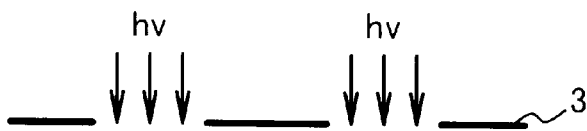
Figure 1C:
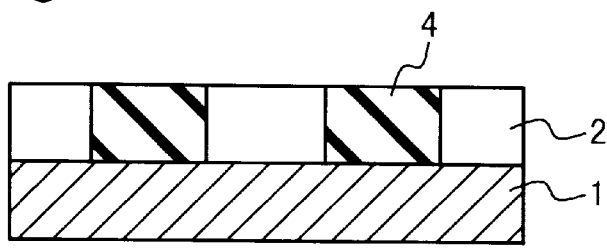

Next, as shown in FIGS. 1B and 1C, the photoresist film 2 is selectively exposed by use of an exposure unit. Then, after the exposure, a heating process is performed to a photoresist film 2. As a result, the bridging of resin occurs in an exposure area 4.

Figure 1D:
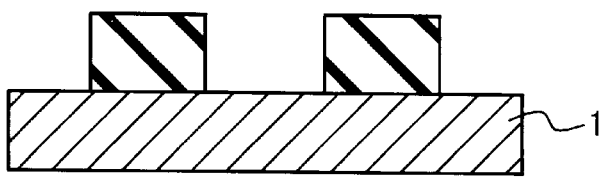

Finally, as shown in FIG. 1D, only the non-exposure portion of the photoresist film 2 is selectively dissolved and removed by alkaline developer such as tetramethylammonium hydroxide (TMAH). Thus, a negative type photoresist pattern is formed.

The negative type photoresist material of the present invention has a high transparency to a light with the wavelength equal to or less than 220 nm such as an ArF excimer laser light. Also, the negative type photoresist material has dry etching durability and high resolution. Therefore, the negative type photoresist material of the present invention can be utilized as a new negative type photoresist material for manufacture of a semiconductor device. By using the negative type photoresist material of the present invention for a photolithography process, the negative type photoresist pattern can be formed.

EMBODIMENT EXAMPLES

Next, the present invention will be described in detail in the following embodiment examples but the present invention is not limited at all by the se embodiment examples.

Embodiment 1

The photoresist having the following composition is produced. The following experiment is performed under a yellow lamp.

(a) resin A1 (A1 shown below) 4.2 g
(b) MX280 (commercially available from Sanwa Chemical) (main ingredient: B1 shown below) 0.75 g
(c) bis(cylcohexylsulfonil) diazomethanes (C1 shown below) 0.05 g
(d) ethyl lactate 33 g The chemical formula A1 is as follows,

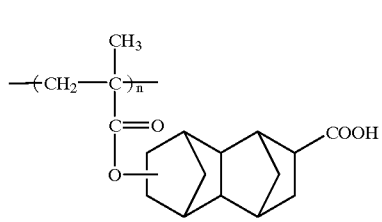

(A1)

The chemical formula B1 is as follows,

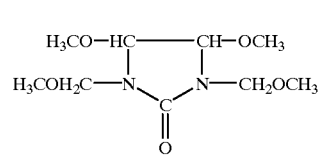

(B1)

The chemical formula C1 is as follows,

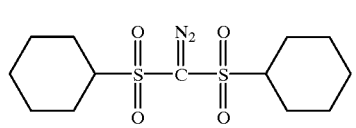

(C1)

The molecular weight of the resin A1 was 28,000. Here, the molecular weight is measured by a gel permiation chromatography (GPC) using LC-9A commercially available from Shimazu Seisakusyo (column: F-80M produced by Showa Denko). Then, the molecular weight is determined as the polystyrene reduced molecular weight.

The above mixture is filtered with a Tetoron filter of 0.2 μm to produce the photoresist material. The photoresist material is applied on a quartz substrate of 3-inch by a spin coating method, and is heated on a hot plate for 60 seconds at 100° C. to form the film with the film thickness of 0.5 μm. The transmittance of this film to the light with the wavelength of 193.4 nm (a central wavelength of the ArF excimer laser light) was 60.5%. This is an enough transparency as a single layer photoresist.

Embodiment 2

Like the embodiment 1, the photoresist material was produced using MX290 (main component: B2 shown below) of 0.47 g instead of MX280. Then, a thin film was formed from the photoresist material and the transmittance of the thin film was measured. As a result, the transmittance was 50.2% for the light with the wavelength of 193.4 nm and showed an enough transparency as a single layer photoresist. The chemical formula B2 is as follows,

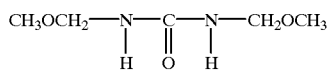

(B2)

Embodiment 3

Like the embodiment 1, the photoresist material was produced using a crosslinker having the structure of B3 shown below instead of MX280. Then, a film was formed from the photoresist material and the transmittance of the film was measured. As a result, the transmittance was 60.2% for the light with the wavelength of 193.4 nm and showed an enough transparency as a single layer photoresist.
The chemical formula B3 is as follows,

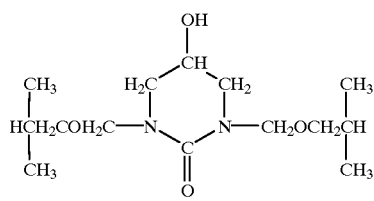

(B3)

Embodiment 4

Like the embodiment 1, the photoresist material was produced using a crosslinker having the structure of B4 shown below instead of MX280. Then, a thin film was formed from the photoresist material and the transmittance of the film was measured. As a result, the transmittance was 55.6% for the light with the wavelength of 193.4 nm and showed an enough transparency as a single layer photoresist. The chemical formula B4 is as follow,

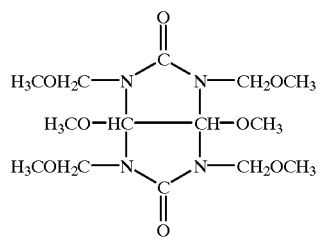

(B4)

Embodiment 5

Like the embodiment 1, the photoresist material was produced using resin A2 (A2 shown below) instead of the resin A1. Then, the transmittance of a thin film formed from the photoresist material was measured. The molecular weight of the resin A2 is measured by a gel permeation chromatography (GPC) and the polystyrene reduced molecular weight was 21,000. As a result, the transmittance was 58.2% for the light with the wavelength of 193.4 nm and showed an enough transparency as a single layer photoresist. The chemical formula A2 is as follow,

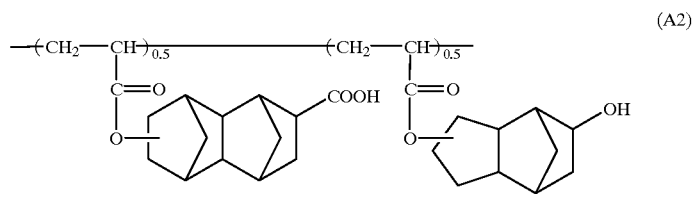

(A2)

Embodiment 6

The photoresist having the following composition is produced. The following experiment was performed under a yellow lamp.
  (a) resin A3 (A3 shown below) 2.5 g
  (b) a crosslinker B4 (B4 shown below) 0.3 g
  (c) triphenylsulfonium trifluolomethanesulfonate 0.03 g
  (d) diethyleneglycol dimethyl ether 11.3 g
The chemical formula A3 is as follows,

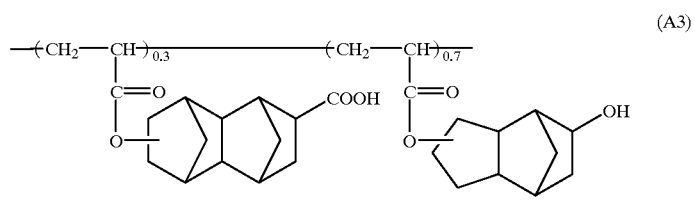

(A3)

The chemical formula B4 is as follows,

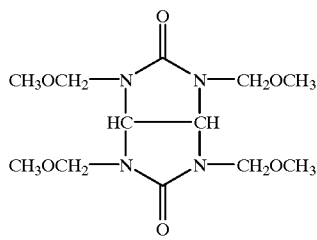

(B4)

The chemical formula C2 is as follows,

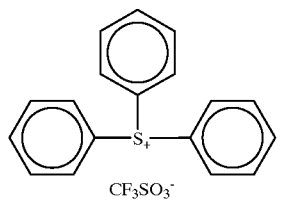

(C2)

The molecular weight of the resin A3 was measured by the gel permeation chromatography and the polystyrene reduced molecular weight was determined to be 8,200.

The above mixture was filtered with a Tetoron filter of 0.2 μm to produce the photoresist material. The photoresist material was applied on a quartz substrate of 3-inch by a spin coating method, and was heated on a hot plate for 60 seconds at 100° C. to form the film with the film thickness of 0.5 μm. The transmittance of the film to the light with the wavelength of 193.4 nm (a central wavelength of the ArF excimer laser light) was 51.5%. This is an enough transparency as a single layer photoresist.

Embodiment 7

The photoresist having the following composition is produced. The following experiment was performed under a yellow lamp.

(a) resin 1 (A1 shown in the embodiment 1) 4.2 g
(b) MX280 (commercially available from Sanwa Chemical) (main component: B1 shown in the embodiment 1) 1.05 g
(d) ethyl lactate 25 g The above mixture was filtered with a Tetoron filter of 0.2 μm to produce the photoresist material. The photoresist material was applied on a quartz substrate of 3-inch by a spin coating method, and was heated on a hot plate for 60 seconds at 100° C. to form the film with the film thickness of 0.7 μm. The etching rate of the formed film to a CF4 gas was measured by use of a reactive ion etching (RIE) apparatus DEM451 commercially available from Nichiden Aneruva (etching condition: Power=100 W, pressure=5 Pa, and gas flow rate=30 sccm). The measuring results are shown in a table 3. The measuring results of novolak photoresist as a comparative example (PFI-15A from Sumitomo Chemical Co.), poly(p-vinylphenol) which is used as base resin of a KrF photoresist, and a poly(methylmethaclylate) application film which is a resin not to have a bridged cyclic hydrocarbon group in the molecule structure are also shown. It should be noted that the etching rage is normalized with respect to that of the novolak photoresist. From the obtained results, the etching rate to CF4 gas is slow and the photoresist of the present invention is excellent in the dry etching durability.

It will be shown that the photoresist of the present invention has high dry etching durability.

Embodiment 8

Like the embodiment 6, the etching rate of the photoresist material using resin A2 (A2 shown in the embodiment 5) instead of the resin A1 was measured. The measuring results are shown in a table 2. From the obtained results, it is shown that the photoresist of the present invention has a low etching rate to the CF4 gas and is excellent in the dry etching durability. That is, the photoresist of the present invention has a high dry etching durability.

TABLE 2

|  | etching rate (relative ratio) |
|---|---|
| Embodiment 7 | 1.05 |
| Embodiment 8 | 1.19 |
| poly(methyl methaclylate) | 1.9 |
| poly(p-vinylphenol) | 1.2 |
| novolak photoresist (PFI-15A) | 1 |

Embodiment 9

The photoresist having the following composition is produced. The following experiment was performed under a yellow lamp.

(a) resin A1 (A1 shown in the embodiment 1) 4 g
(b) MX280 (commercially available from Sanwa Chemical) (main ingredient: B1 shown in the embodiment 2) 1 g
(c) bis(cylcohexylsulfonyl)diazomethanes (C1 shown in the embodiment 1) 0.05 g
(d) ethyl lactate 28.6 g The above mixture is filtered with a Tetoron filter of 0.2 μm to produce the photoresist material. The photoresist material is applied on a quartz substrate of 3-inch by a spin coating method, and is heated on a hot plate for 60 seconds at 100° C. to form the film with the film thickness of 0.5 μm. The film is stationarily located in a contact exposure system which is sufficiently purged with a nitrogen gas. A mask in which a pattern is drawn with chrome on a quartz plate is fitly located on the photoresist film and the ArF excimer laser light is irradiated through the mask. Immediately after the irradiation, a baking process is performed on a hot plate at 140° C. for 60 seconds. Then, the photoresist film is developed by an immersion method for 60 seconds using 2.38% TMAH solution of the solution temperature of 23° C. Subsequently, a rinse process with pure water is performed for 60 seconds. As a result, only the non-exposed portion of the photoresist film is dissolved and removed into the a developer. A negative type pattern of 0.3 μmL/S was obtained with the exposure dose of 72 mJ/cm².

Embodiment 10

Like the embodiment 9, the photoresist material is produced using MX290 (main component: B2 shown in the embodiment 2) instead of MX280 and a film is produced from the photoresist material. Then, the exposing experiment was performed. As a result, a negative type pattern of 0.45 μmL/S was obtained with the exposure dose of 105 mJ/cm².

Embodiment 11

Like the embodiment 9, the photoresist material is produced using a compound having the structure of B3 shown in the embodiment 3 instead of MX290 and a film is produced from the photoresist material. Then, the exposing experiment was performed. As a result, a negative type pattern of 0.275 μmL/S was obtained with the exposure dose of 96 mJ/cm².

Embodiment 12

Like the embodiment 9, the photoresist material is produced using a compound having the structure of B4 shown in the embodiment 4 instead of MX280 and a film is produced from the photoresist material. Then, the exposing experiment was performed. As a result, a negative type pattern of 0.35 μmL/S was obtained with the exposure dose of 90 mJ/cm².

Embodiment 13

Like the embodiment 9, the photoresist material is produced using norbornil(2-oxocyclohexyl)methylsulfonium trifluolomethanesulfonate (C3 shown below) instead of bis(dicyclohexylsulfonyl)diaxomethane. Then, the exposing experiment was performed. As a result, a negative type pattern of 0.275 μmL/S was obtained with the exposure dose of 55 mJ/cm². The chemical formula C3 is as follows,

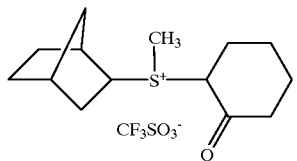

(C3)

Embodiment 14

Like the embodiment 9, the photoresist material is produced using hydroxysccinimide trifluolomethanesulfonate ester (C4 shown below) instead of bis(dicyclohexylsulfonil)diaxomethane. Then, the exposing experiment was performed. As a result, a negative type pattern of 0.275 μmL/S was obtained with the exposure dose of 25 mJ/cm².

The chemical formula C4 is as follows,

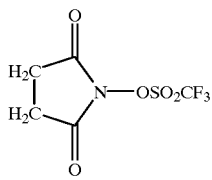

(C4)

Embodiment 15

Like the embodiment 9, the photoresist material is produced using bis(tertiary-butylphenyl)iodonium trifluolomethanesulfonate (C5 shown below) instead of bis(dicyclohexylsulfonyl)diaxomethane. Then, the exposing experiment was performed. As a result, a negative type pattern of 0.40 μmL/S was obtained with the exposure dose of 15 mJ/cm². The chemical formula C5 is as follows,

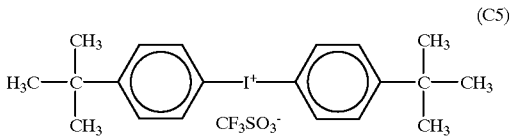

(C5)

Embodiment 16

The photoresist having the following composition is produced. The following experiment was performed under a yellow lamp.

(a) resin A2 (A2 shown in the embodiment 5) 2.5 g
(b) crosslinker B4 (B4 shown in the embodiment 6) 0.3 g
(c) triphenylsulfonium trifluolomethanesulfonate (C2 shown in the embodiment 6) 0.03 g
(d) diethyleneglycol dimethyl ether 11.2 g The above mixture is filtered with a Tetoron filter of 0.2 μm to produce the photoresist material. The photoresist material is applied on a silicon substrate of 6-inche square by a spin coating method, and is heated on a hot plate for 60 seconds at 100° C. to form the film with the film thickness of 0.45 μm. The film is exposed by use of ArF reduction exposure apparatus (NA=0.55) which is commercially available from NIKON. Immediately after the exposure, a baking process is performed on a hot plate at 95° C. for 60 seconds. Then, the photoresist film is developed by an immersion method for 60 seconds using 2.38% TMAH solution of the solution temperature of 23° C. As a result, only the non-exposed portion of the photoresist film is dissolved and removed into the a developer. Thus, a negative type pattern of 0.25 μmL/S was obtained with the exposure dose of 3.5 mJ/cm².

Embodiment 17

Like the embodiment 16, the photoresist material is produced using the resin A3 (A3 shown in the embodiment 6) instead of the resin A2. Then, the exposing experiment was performed. As a result, a negative type pattern of 0.225 μmL/S was obtained with the exposure dose of 2.35 mJ/cm².

Embodiment 18

The photoresist having the following composition is produced. The following experiment was performed under a yellow lamp.

(a) resin A3 (A3 shown in the embodiment 6) 0.6 g
(b) crosslinker B4 (B4 shown in the embodiment 6) 0.072 g
(c) triphenylsulfonium trifluolomethanesulfonate (C1 shown in the embodiment 6) 0.0084 g
(d) polyhydronic alcohol D1(D1 shown below) 0.032 g
(e) diethyleneglycol dimethyl ether 2.7 g The above mixture is filtered with a Tetoron filter of 0.2 μm to produce the photoresist material. The photoresist material is applied on a silicon substrate of 6-inche square by a spin coating method, and is heated on a hot plate for 60 seconds at 100° C. to form the film with the film thickness of 0.45 μm. The film is exposed by use of an ArF reduction exposure apparatus (NA=0.55) which is commercially available from NIKON. Immediately after the exposure, a baking process is performed on a hot plate at 115° C. for 60 seconds. Then, the photoresist film is developed by an immersion method for 60 seconds using 2.38% TMAH solution of the solution temperature of 23° C. Subsequently, a rinse process is performed with pure water for 60 seconds. As a result, only the non-exposed portion of the photoresist film is dissolved and removed into the a developer. Thus, a negative type pattern of 0.18 μmL/S was obtained with the exposure dose of 9.2 mJ/cm². The chemical formula D1 is as follows,

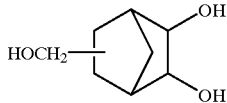

(D1)

Embodiment 19

Like the embodiment 18, the photoresist material is produced using the crosslinker B5 (B5 shown below) instead of the crosslinker B4. Then, the exposing experiment was performed. As a result, a negative type pattern of 0.275 μmL/S was obtained with the exposure dose of 12 mJ/cm². The chemical formula B5 is as follow,

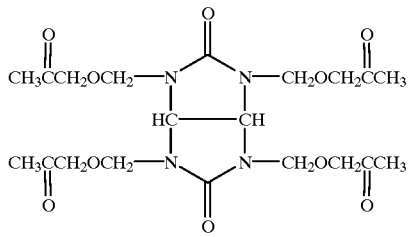

(B5)

As seen from the above description, the negative type photoresist material of the present invention is superior in the transparency so that it can be used for lithography which uses the short wavelength light such as the ArF excimer laser. Also, the negative type photoresist material of the present invention has the dry etching durability and high resolution, it is possible to use the negative type photoresist material for the fine pattern formation which is necessary to manufacture a semiconductor device.

What is claimed is:

1. A negative photoresist composition comprising:
    a polymer which contains a repetition unit which is expressed by a general chemical formula (1);
    a crosslinker composed of a compound which contains a functional group which is expressed by a general chemical formula (2); and
    a photo-acid generator which generates acid in response to a light,

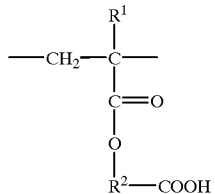

(1)

where in the general chemical formula (1), $R^1$ is a hydrogen atom or a methyl group, $R^2$ is an alkylene group containing carbon atoms in a range of 7 to 18 and having a bridged cyclic hydrocarbon group, and a weight average molecular weight of the polymer is in a range of 1000 to 500000, and

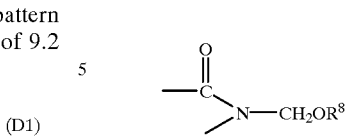

(2)

where in the general chemical formula (2), $R^8$ is a hydrogen atom, or an alkyl group containing carbon atoms in a range of 1 to 6 or an oxoalkyl group containing carbon atoms in a range of 3 to 6.

2. A negative photoresist composition according to claim 1, further comprising polyhydric alcohol compound.

3. A negative photoresist composition according to claim 1, wherein said polymer is a polymer which is expressed by a general chemical formula (3),

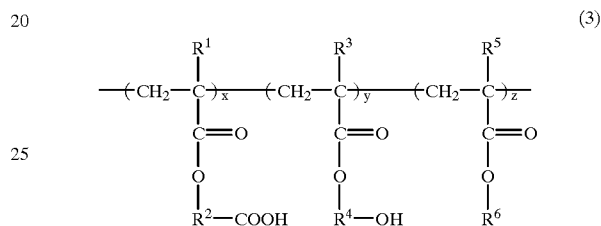

(3)

where in the general chemical formula (3), each of $R^1$, $R^3$ and $R^5$ is a hydrogen atom or a methyl group, each of $R^2$ and $R^4$ is an alkylene group containing carbon atoms in a range of 7 to 18 and having a bridged cyclic hydrocarbon group, $R^6$ is a hydrogen atom or an alkyl group containing carbon atoms in a range of 1 to 12, x, y and z satisfies x+y+z=1, 0<x<1, 0<y<1, and 0≦z<1, and a weight average molecular weight of the polymer is in a range of 1000 to 500000.

4. A negative photoresist composition according to claim 1, wherein said crosslinker is a compound expressed by a general chemical formula (4),

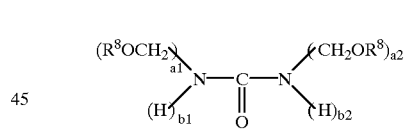

(4)

where in the general chemical formula (4), $R^8$ is a hydrogen atom, an alkyl group containing carbon atoms in a range of 1 to 6, or an oxoalkyl group containing carbon atoms in a range of 3 to 6, and a1=1 or 2, a2=1 or 2, b1=0 or 1, b2=0 or 1, a1+b1=2, and a2+b2=2.

5. A negative photoresist composition according to claim 1, wherein said crosslinker is a compound which is expressed by a general chemical formula (5),

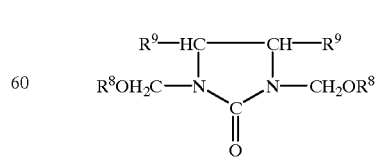

(5)

where in the general chemical formula (5), $R^8$ is a hydrogen atom, an alkyl group containing carbon atoms in a range of 1 to 6, or an oxoalkyl group containing carbon atoms in a range of 3 to 6, $R^9$ is a hydrogen atom, a hydroxyl group, an alkoxy group containing carbon atoms in a range of 1 to 6, or an oxoalkoxy group containing carbon atoms in a range of 3 to 6.

6. A negative photoresist composition according to claim 1, wherein said crosslinker is a compound which is expressed by a general chemical formula (6),

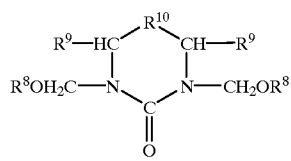
(6)

where in the general chemical formula (6), $R^8$ is a hydrogen atom, an alkyl group containing carbon atoms in a range of 1 to 6 or an oxoalkyl group containing carbon atoms in a range of 3 to 6, $R^9$ is a hydrogen atom, a hydroxyl group, or an alkoxy group containing carbon atoms in a range of 1 to 6, or an oxoalkoxy group containing carbon atoms in a range of 3 to 6, $R^{10}$ is an oxygen atom, a sulfur atom, an alkylene group containing carbon atoms in a range of 1–3, or a hydroxymethylene group.

7. A negative photoresist composition according to claim 1, wherein said crosslinker is a compound which is expressed by a general chemical formula (7),

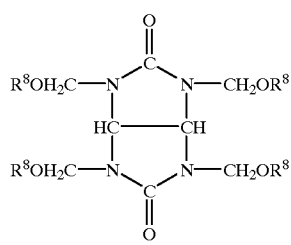
(7)

wherein in the general chemical formula (7), $R^8$ is a hydrogen atom, an alkyl group containing carbon atoms in a range of 1 to 6, or an oxoalkyl group containing carbon atoms in a range of 3 to 6.

8. A negative photoresist composition according to claim 1, wherein said crosslinker is a compound which is expressed by a general chemical formula (8),

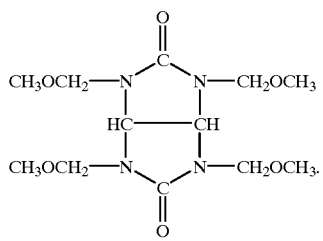
(8)

9. A negative photoresist composition according to claim 1, wherein said photo-acid generator is a sulfonium salt compound which is expressed by a general chemical formula (9),

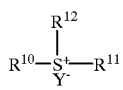
(9)

where in the general chemical formula (9), $R^{10}$, $R^{11}$, and $R^{12}$ are respectively independently an alkyl substituted or halogen substituted aromatic group or an aromatic group of non-substitution, an alicyclic group, a bridged cyclic hydrocarbon group, 2-oxoalicyclic group, or an alkyl group, and $Y^-$ is a counter anion expressed by $BF_4^-$, $AsF_6^-$, $SbF_6^-$ or a general chemical formula (10), $$Z\text{—}SO_3^- \quad (10)$$

where in the general chemical formula (10), Z is $C_nF_{2n+1}$ (n is an integer in a range from 1 to 6), or an alkyl group, an alkyl substituted or halogen substituted aromatic group or an aromatic group of non-substitution.

10. A negative photoresist composition according to claim 1, wherein said photo-acid generator is an iodonium salt compound which is expressed by a general chemical formula (11),

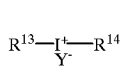
(11)

where in the general chemical formula (11), $R^{13}$ and $R^{14}$ are respectively independently an alkyl substituted or halogen substituted aromatic group or an aromatic group of non-substitution, an alicyclic group, a bridged cyclic hydrocarbon group, 2-oxoalicyclic group, or an alkyl group, and $Y^-$ is a counter anion expressed by $BF_4^-$, $AsF_6^-$, $SbF_6^-$ or a general chemical formula (12), $$Z\text{—}SO_3^- \quad (12)$$

where in the general chemical formula (12), Z is $C_nF_{2n+1}$ (n is an integer in a range from 1 to 6), or an alkyl group, an alkyl substituted or halogen substituted aromatic group or an aromatic group of non-substitution.

11. A negative photoresist composition according to claim 1, wherein said photo-acid generator is a succinimide derivative which is expressed by a general chemical formula (13),

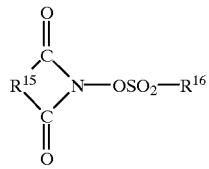
(13)

wherein in the general chemical formula (13), $R^{15}$ is a halogen substituted alkylene group, or an alkylene group of non-substitution, an alkyl or halogen substituted aromatic group, or an aromatic group of non-substitution, $R^{16}$ is a halogen substituted alkyl group, an alkyl group of non-substitution, an alkyl or halogen substituted aromatic group or an aromatic group of non-substitution.

12. A negative photoresist composition according to claim 1, wherein said photo-acid generator is a diazo compound which is expressed by a general chemical formula (14),

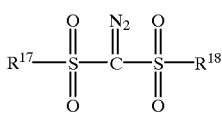
(14)

where in the general chemical formula (14), $R^{17}$ and $R^{18}$ are respectively independently an alkyl group, an alkyl substituted or halogen substituted aromatic group or an aromatic group of non-substitution, an alicyclic group, or a bridged cyclic hydrocarbon group.

13. A negative photoresist composition according to claim 1, wherein said negative type photoresist composition contains said polymer at 50–98 weight percent, said crosslinker at 1–50 weight percent, and said photo-acid generator at 0.2–15 weight percent.

14. A method of forming a photoresist pattern, comprising the steps of:
applying a negative type photoresist composition on a substrate;
exposing said negative type photoresist composition by a light with a wavelength of 180 to 220 nm;
performing baking of said substrate on which said negative type photoresist composition is applied; and
performing development of said baked substrate, and
wherein said negative type photoresist composition includes:
a polymer which contains a repetition unit which is expressed by a general chemical formula (15);
a crosslinker composed of a compound which contains a functional group which is expressed by a general chemical formula (16); and
a photo-acid generator which generates acid in response to a light,

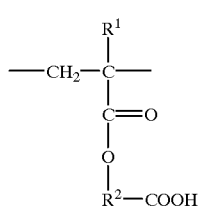
(15)

where in the general chemical formula (15), $R^1$ is a hydrogen atom or a methyl group, $R^2$ is an alkylene group containing carbon atoms in a range of 7 to 18 and having a bridged cyclic hydrocarbon group, and a weight average molecular weight of the polymer is in a range of 1000 to 500000, and

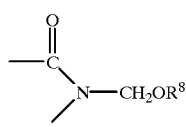
(16)

where in the general chemical formula (16), $R^8$ is a hydrogen atom, or an alkyl group containing carbon atoms in a range of 1 to 6 or an oxoalkyl group containing carbon atoms in a range of 3 to 6.

15. A method according to claim 14, wherein said negative type photoresist composition further includes polyhydric alcohol compound.

16. A method of forming a photoresist pattern according to claim 14, wherein said light with the wavelength of 180 nm to 220 nm is an ArF excimer laser light.

17. A negative photoresist composition comprising:
a polymer which contains a repetition unit which is expressed by a general chemical formula (17);
a crosslinker composed of a compound which contains a functional group which is expressed by a general chemical formula (18);
a photo-acid generator which generates acid in response to a light; and
a polyhydric alcohol compound;

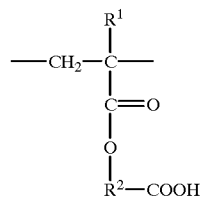
(17)

where in the general chemical formula (17), $R^1$ is a hydrogen atom or a methyl group, $R^2$ is an alkylene group containing carbon atoms in a range of 7 to 18 and having a bridged cyclic hydrocarbon group, and a weight average molecular weight of the polymer is in a range of 1000 to 500000, and

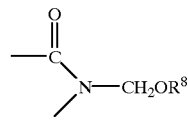
(18)

where in the general chemical formula (18), $R^8$ is a hydrogen atom, or an alkyl group containing carbon atoms in a range of 1 to 6 or an oxoalkyl group containing carbon atoms in a range of 3 to 6.

18. A negative photoresist composition according to claim 17, wherein said polymer is a polymer which is expressed by a general chemical formula (19),

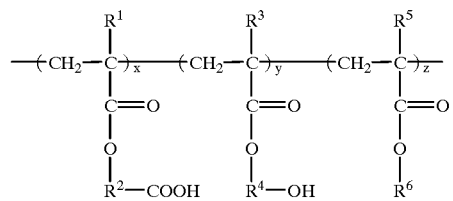
(19)

where in the general chemical formula (19), each of $R^1$, $R^3$ and $R^5$ is a hydrogen atom or a methyl group, each of $R^2$ and $R^4$ is an alkylene group containing carbon atoms in a range of 7 to 18 and having a bridged cyclic hydrocarbon group, $R^6$ is a hydrogen atom or an alkyl group containing carbon atoms in a range of 1 to 12, x, y and z satisfies x+y+z=1, $0 < x < 1$, $0 < y < 1$, and $0 \leq z < 1$, and a weight average molecular weight of the polymer is in a range of 1000 to 500000.

19. A negative photoresist composition according to claim 17, wherein said crosslinker is a compound expressed by a general chemical formula (20),

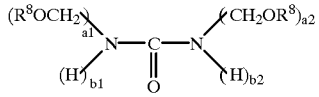
(20)

where in the general chemical formula (20), $R^8$ is a hydrogen atom, an alkyl group containing carbon atoms in a range of 1 to 6, or an oxoalkyl group containing carbon atoms in a range of 3 to 6, and a1=1 or 2, a2=1 or 2, b1=0 or 1, b2=0 or 1, a1+b1=2, and a2+b2=2.

20. A negative photoresist composition according to claim 17, wherein said crosslinker is a compound which is expressed by a general chemical formula (21),

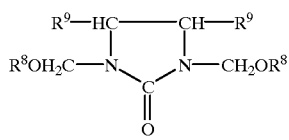
(21)

where in the general chemical formula (21), $R^8$ is a hydrogen atom, an alkyl group containing carbon atoms in a range of 1 to 6, or an oxoalkyl group containing carbon atoms in a range of 3 to 6, $R^9$ is a hydrogen atom, a hydroxyl group, an alkoxy group containing carbon atoms in a range of 1 to 6, or an oxoalkoxy group containing carbon atoms in a range of 3 to 6.

21. A negative photoresist composition according to claim 17, wherein said crosslinker is a compound which is expressed by a general chemical formula (22),

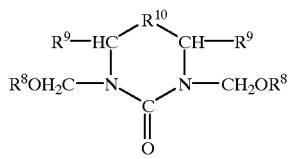
(22)

where in the general chemical formula (22), $R^8$ is a hydrogen atom, an alkyl group containing carbon atoms in a range of 1 to 6 or an oxoalkyl group containing carbon atoms in a range of 3 to 6, $R^9$ is a hydrogen atom, a hydroxyl group, or an alkoxy group containing carbon atoms in a range of 1 to 6, or an oxoalkoxy group containing carbon atoms in a range of 3 to 6, $R^{10}$ is an oxygen atom, a sulfur atom, an alkylene group containing carbon atoms in a range of 1–3, or a hydroxymethylene group.

22. A negative photoresist composition according to claim 17, wherein said crosslinker is a compound which is expressed by a general chemical formula (23),

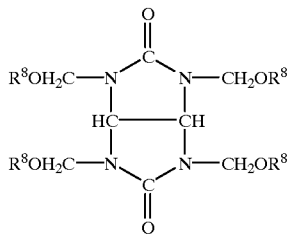
(23)

wherein in the general chemical formula (23), $R^8$ is a hydrogen atom, an alkyl group containing carbon atoms in a range of 1 to 6, or an oxoalkyl group containing carbon atoms in a range of 3 to 6.

23. A negative photoresist composition according to claim 17, wherein said crosslinker is a compound which is expressed by a general chemical formula (24),

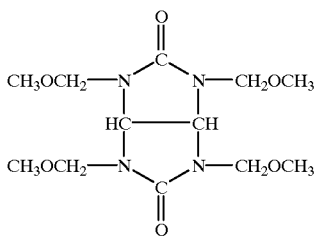
(24)

24. A negative photoresist composition according to claim 17, wherein said photo-acid generator is a sulfonium salt compound which is expressed by a general chemical formula (25),

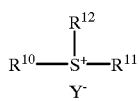
(25)

where in the general chemical formula (25), $R^{10}$, $R^{11}$ and $R^{12}$ are respectively independently an alkyl substituted or halogen substituted aromatic group or an aromatic group of non-substitution, an alicyclic group, a bridged cyclic hydrocarbon group, 2-oxoalicyclic group, or an alkyl group, and $Y^-$ is a counter anion expressed by $BF_4^-$, $AsF_6^-$, $SbF_6^-$ or a general chemical formula (26), $$Z-SO_3^- \qquad (26)$$

where in the general chemical formula (26), Z is $C_nF_{2n+1}$ (n is an integer in a range from 1 to 6), or an alkyl group, an alkyl substituted or halogen substituted aromatic group or an aromatic group of non-substitution.

25. A negative photoresist composition according to claim 17, wherein said photo-acid generator is an iodonium salt compound which is expressed by a general chemical formula (27), (27)

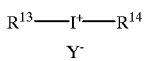

where in the general chemical formula (27), $R^{13}$ and $R^{14}$ are respectively independently an alkyl substituted or halogen substituted aromatic group or an aromatic group of non-substitution, an alicyclic group, a bridged cyclic hydrocarbon group, 2-oxoalicyclic group, or an alkyl group, and $Y^-$ is a counter anion expressed by $BF_4^-$, $AsF_6^-$, $SbF_6^-$ or a general chemical formula (28),

 (28)

where in the general chemical formula (28), Z is $C_nF_{2n+1}$ (n is an integer in a range from 1 to 6), or an alkyl group, an alkyl substituted or halogen substituted aromatic group or an aromatic group of non-substitution.

26. A negative photoresist composition according to claim 17, wherein said photo-acid generator is a succinimide derivative which is expressed by a general chemical formula (29), (29)

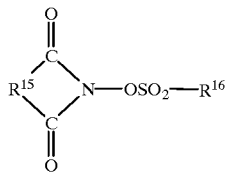

where in the general chemical formula (29), $R^{15}$ is a halogen substituted alkylene group, or an alkylene group of non-substitution, an alkyl or halogen substituted aromatic group, or an aromatic group of non-substitution, $R^{16}$ is a halogen substituted alkyl group, an alkyl group of non-substitution, an alkyl or halogen substituted aromatic group or an aromatic group of non-substitution.

27. A negative photoresist composition according to claim 17, wherein said photo-acid generator is a diazo compound which is expressed by a general chemical formula (30), (30)

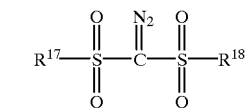

where in the general chemical formula (30), $R^{17}$ and $R^{18}$ are respectively independently an alkyl group, an alkyl substituted or halogen substituted aromatic group or an aromatic group of non-substitution, an alicyclic group, or a bridged cyclic hydrocarbon group.

28. A negative photoresist composition according to claim 17, wherein said negative type photoresist composition contains said polymer at 50–98 weight percent, said crosslinker at 1–50 weight percent, and said photo-acid generator at 0.2–15 weight percent.

* * * * *

UNITED STATES PATENT AND TRADEMARK OFFICE
CERTIFICATE OF CORRECTION

PATENT NO. : 6,074,801
DATED : June 13, 2000
INVENTOR(S) : Shigeyuki IWASA, Katsumi MAEDA, Kaichiro NAKANO, Etsuo HASEGAWA It is certified that error appears in the above-indentified patent and that said Letters Patent is hereby corrected as shown below:

Column 8, line 11, delete "7" insert --$^7$--;
line 12, delete "6" insert --$^6$--.
Column 13, line 5, delete "6" insert --$^6$--.

Column 34, lines 25-27 (formula 24)

delete "  " insert -- 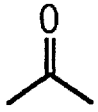 --.

Signed and Sealed this

Tenth Day of April, 2001

Attest:

NICHOLAS P. GODICI

Attesting Officer    Acting Director of the United States Patent and Trademark Office